(12) United States Patent
Rennig et al.

(10) Patent No.: US 12,417,200 B2
(45) Date of Patent: *Sep. 16, 2025

(54) SYSTEM AND METHOD FOR COMMUNICATION BETWEEN A COMMANDER DEVICE AND A RESPONDER DEVICE

(71) Applicants: STMicroelectronics Design & Application S.R.O., Prague (CZ); STMicroelectronics Application GMBH, Aschheim-Dornach (DE)

(72) Inventors: Fred Rennig, Nandlstadt (DE); Ludek Beran, Strancice (CZ)

(73) Assignees: STMicroelectronics Application GMBH, Aschheim-Dornach (DE); STMicroelectronics Design & Application S.R.O., Prague (CZ)

( * ) Notice: Subject to any disclaimer, the term of this patent is extended or adjusted under 35 U.S.C. 154(b) by 0 days.

This patent is subject to a terminal disclaimer.

(21) Appl. No.: 18/764,940

(22) Filed: Jul. 5, 2024

(65) Prior Publication Data

US 2024/0362176 A1 Oct. 31, 2024

Related U.S. Application Data

(63) Continuation of application No. 18/309,103, filed on Apr. 28, 2023, now Pat. No. 12,066,962, which is a
(Continued)

(30) Foreign Application Priority Data

Mar. 26, 2018 (IT) .......................... 102018000003980

(51) Int. Cl.
*G06F 13/362* (2006.01)
*G05B 19/042* (2006.01)
(Continued)

(52) U.S. Cl.
CPC ......... *G06F 13/362* (2013.01); *G05B 19/042* (2013.01); *G06F 9/542* (2013.01);
(Continued)

(58) Field of Classification Search
CPC .... G06F 13/362; G06F 9/542; G06F 11/0739; G06F 11/0757; G06F 11/0772;
(Continued)

(56) References Cited

U.S. PATENT DOCUMENTS 5,509,122 A 4/1996 Bartow et al.
6,240,478 B1 5/2001 Brickell
(Continued)

FOREIGN PATENT DOCUMENTS

CN 209642692 U 11/2019
EP 1158718 A2 11/2001
(Continued)

OTHER PUBLICATIONS

Bosch, "CAN with Flexible Data-Rate", Specification Version 1.0, Apr. 17, 2012, 34 pages.
(Continued)

*Primary Examiner* — Glenn A. Auve
(74) *Attorney, Agent, or Firm* — Slater Matsil, LLP

(57) ABSTRACT

A device includes a master device, a set of slave devices and a bus. The master device is configured to transmit first messages carrying a set of operation data message portions indicative of operations for implementation by slave devices of the set of slave devices, and second messages addressed to slave devices in the set of slave devices. The second messages convey identifiers identifying respective ones of the slave devices to which the second messages are addressed requesting respective reactions towards the master device within respective expected reaction intervals. The slave devices are configured to receive the first messages
(Continued)

transmitted from the master device, read respective operation data message portions in the set of operation data message portions, implement respective operations as a function of the respective operation data message portions read, and receive the second messages transmitted from the master device.

20 Claims, 8 Drawing Sheets

Related U.S. Application Data continuation of application No. 17/806,587, filed on Jun. 13, 2022, now Pat. No. 11,675,721, which is a continuation of application No. 16/874,055, filed on May 14, 2020, now Pat. No. 11,366,778, which is a continuation of application No. 16/360,229, filed on Mar. 21, 2019, now Pat. No. 10,678,726.

(51) Int. Cl.
| | | |
|---|---|---|
| *G06F 9/54* | (2006.01) | |
| *G06F 11/07* | (2006.01) | |
| *G06F 11/10* | (2006.01) | |
| *G06F 13/40* | (2006.01) | |
| *G06F 13/42* | (2006.01) | |
| *H03M 13/09* | (2006.01) | |
| *H04L 12/40* | (2006.01) | |
| *H04L 12/403* | (2006.01) | |

(52) U.S. Cl.
CPC ...... *G06F 11/0739* (2013.01); *G06F 11/0757* (2013.01); *G06F 11/0772* (2013.01); *G06F 11/1004* (2013.01); *G06F 13/4068* (2013.01); *G06F 13/4282* (2013.01); *H04L 12/40006* (2013.01); *H04L 12/40013* (2013.01); *H04L 12/40078* (2013.01); *H04L 12/403* (2013.01); *G05B 2219/1215* (2013.01); *G05B 2219/2231* (2013.01); *G05B 2219/31179* (2013.01); *H03M 13/09* (2013.01); *H04L 2012/40215* (2013.01)

(58) Field of Classification Search
CPC ............ G06F 11/1004; G06F 13/4068; G06F 13/4282; G06F 9/546; G06F 13/4072; H04L 12/40006; H04L 12/40013; H04L 12/40078; H04L 12/403; H04L 2012/40215; H04L 1/0061; H04L 1/1607; H04L 2012/40273; H04L 12/40169; H04L 12/4013; G05B 19/042; G05B 2219/1215; G05B 2219/2231; G05B 2219/31179; H03M 13/09
See application file for complete search history.

(56) References Cited

U.S. PATENT DOCUMENTS

| | | | |
|---|---|---|---|
| 6,467,065 | B1 | 10/2002 | Mendez et al. |
| 9,252,969 | B2 | 2/2016 | Rohatschek et al. |
| 10,678,726 | B2 | 6/2020 | Rennig et al. |
| 11,366,778 | B2* | 6/2022 | Rennig ................ G05B 19/042 |
| 11,675,721 | B2* | 6/2023 | Rennig ............. H04L 12/40006 |
| | | | 710/110 |
| 12,066,962 | B2* | 8/2024 | Rennig ............. H04L 12/40078 |
| 2004/0047298 | A1 | 3/2004 | Yook et al. |
| 2007/0294443 | A1 | 12/2007 | Berenbaum et al. |
| 2009/0021955 | A1 | 1/2009 | Kuang et al. |
| 2009/0157929 | A1 | 6/2009 | Pigott et al. |
| 2010/0306431 | A1 | 12/2010 | Adkins et al. |
| 2011/0289237 | A1 | 11/2011 | Zhang |
| 2012/0083902 | A1 | 4/2012 | Daum et al. |
| 2012/0233341 | A1 | 9/2012 | Mach |
| 2012/0271924 | A1 | 10/2012 | Spitaels et al. |
| 2013/0057339 | A1 | 3/2013 | Koudar |
| 2014/0025854 | A1 | 1/2014 | Breuninger |
| 2015/0192983 | A1 | 7/2015 | Rennig |
| 2016/0191629 | A1 | 6/2016 | Ryu |
| 2018/0013578 | A1 | 1/2018 | Gozloo et al. |
| 2018/0152286 | A1 | 5/2018 | Kemparaj et al. |
| 2018/0159698 | A1 | 6/2018 | Kim |
| 2019/0001904 | A1 | 1/2019 | Sugimoto |
| 2021/0044448 | A1 | 2/2021 | Wetterau et al. |
| 2021/0271924 | A1 | 9/2021 | Tarumi et al. |

FOREIGN PATENT DOCUMENTS

| | | |
|---|---|---|
| JP | 2004280304 A | 3/2003 |
| JP | 2006287684 A | 10/2006 |
| JP | 2009177804 A | 8/2009 |
| JP | 2012075103 A | 4/2012 |
| JP | 2013243758 A | 12/2013 |
| JP | 2016124456 A | 7/2016 |
| WO | 2013052886 A2 | 4/2013 |

OTHER PUBLICATIONS

Microchip, "MCP2517FD External CAN FD Controller with SPI Interface data sheet", DS20005688B, Revision A; Microchip Technology Inc., Aug. 2017, 102 pages.

Microchip "CAN FD Controller Module MCP25xxFD Family Reference Manual", DS20005678B Revision A; Microchip technology Inc., Sep. 2017, 80 pages.

STMicroelectronics, "STM32WB-SPI presentation" accessed on the internet URL <https://www.st.com/resource/en/product_training/STM32WB-Peripheral-Serial-Peripheral-interface-SPI.pdf>; Oct. 6, 2016, 29 pages.

* cited by examiner

SYSTEM AND METHOD FOR COMMUNICATION BETWEEN A COMMANDER DEVICE AND A RESPONDER DEVICE

CROSS-REFERENCE TO RELATED APPLICATIONS

This application is a continuation of U.S. patent application Ser. No. 18/309,103, filed Apr. 28, 2023, which application is a continuation of U.S. patent application Ser. No. 17/806,587, filed Jun. 13, 2022, now U.S. Pat. No. 11,675,721, which application is a continuation of U.S. patent application Ser. No. 16/874,055, filed May 14, 2020, now U.S. Pat. No. 11,366,778, which application is a continuation of U.S. patent application Ser. No. 16/360,229, filed Mar. 21, 2019, now U.S. Pat. No. 10,678,726, which application claims priority to Italian Patent Application No. 102018000003980, filed on Mar. 26, 2018, which applications are hereby incorporated herein by reference.

TECHNICAL FIELD

The description relates a communication method and corresponding systems and devices.

BACKGROUND

Various applications, e.g., in the automotive field, involve exchange of data on one or more bus networks. High data rate, robustness, fault detection, safety and low cost are desirable features for such applications.

Existing high data rate (e.g., 1 Mb/s) standardized vehicle communication systems may involve complex and accurate protocol controllers using external components. These may turn out to be expensive, especially when implemented as single chip analog/bipolar Application Specific Integrated Circuits (ASICs) and/or Application Specific Standard Products (ASSPs).

Vehicle lights (e.g., front, rear, and interior lights) are becoming increasingly sophisticated and distributed (e.g., Matrix LED, ambient LED). Controlling such sophisticated and distributed systems may involve a high data rate control. Moreover, automotive-grade safety and robustness are desirable, especially for front and rear lighting systems.

LED drivers can be cost-efficient, e.g., when employing single-chip technologies such as Bipolar-CMOS-DMOS (BCD) technology. It is otherwise noted that high data rate protocol controllers using, e.g., BCD technology may be expensive and depend on an accurate clock source (crystal).

Differential wiring may be adopted for clock and data signals in order to facilitate robustness, which may increase wire "harness" cost.

The increasing complexity of the communication network in a vehicle, e.g., for driving distributed lighting sources, such as LED matrices, may therefore lead to an increase in production costs which may be hardly compatible with business models in the automotive industry.

One or more embodiments are applicable, for instance, to a CAN (Controller Area Network) bus. This is a well-known arrangement which can facilitate communication between, e.g., microcontrollers and devices on board of a vehicle without a host computer. Operation of a CAN bus can be based on a message-based protocol, as dealt with in standards such as, e.g., ISO 11898-2:2015 and ISO 11898-2:2016.

SUMMARY

Embodiments relate to bus supported communication for use, e.g., in automotive applications. For instance, one or more embodiments may be applied to communication between electronic control units (ECUs) of vehicle lights (e.g., front, rear, interior lights) and corresponding lighting modules, e.g., LED light modules.

Embodiments provide further improved solutions above those described above. For instance, embodiments may facilitate, e.g., realizing cost-effective high data rate vehicle networks for driving distributed LED light sources that comply with automotive requirements in terms of robustness, fault detection, and safety. Similar solutions may also facilitate realizing high data rate networks for implementation in, e.g., production automation systems or the like.

One or more embodiments may relate to a corresponding system.

One or more embodiments may relate to corresponding devices, e.g., transmitter and receiver (interfaces) intended to work together.

One or more embodiments may relate to a corresponding signal.

One or more embodiments may relate to a corresponding vehicle, e.g., a motor vehicle such as a motor car.

One or more embodiments may provide a hardware solution, suitable to realize a communication network for communication between, e.g., electronic control units (ECUs) and lighting modules such as LED light modules.

One or more embodiments may realize a master-slave communication bus interface that can be used in automotive applications.

Such communication bus interface for use in automotive applications may rely on the standardized CAN FD (Flexible Data-Rate) protocol for driving light modules in a vehicle ("CAN FD Light").

One or more embodiments may rely on network technologies other than a standardized CAN FD network, e.g., for use in non-automotive applications, such as, e.g., automation systems or the like.

For instance, one or more embodiments may use differential bus wiring and may provide a defined edge density (e.g., one recessive-to-dominant edge for each 10 bits) for synchronization purposes.

One or more embodiments may implement cyclic redundancy check (CRC) and error checking for safety reasons.

In one or more embodiments, data exchange may rely on a master-slave scheme, wherein the "satellites", that is the slaves, send data over the communication bus (only) upon request from the master device. Such an operating scheme may not involve a collision-resolving feature, insofar as normal operation may aim at avoiding collisions, with collisions treated as errors.

In one or more embodiments, normal operation of the communication bus may involve a master sending (regularly) data to the slaves. Such a (regular) data stream can be used by the slaves as a sort of network "heartbeat" or watchdog. If the regular data stream is not received within a defined time slot, the slaves can enter a fail-safe (or limp-home) mode.

In one or more embodiments, data such as diagnosis data from the slaves, may be sought by the master, e.g., by using dedicated command frames. A certain addressed slave may react on such a request within a certain time frame. Such reactions can be used by the master to detect the availability of slaves.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

As noted, one or more embodiments can provide a "robust" master-slave bus interface that can be used in automotive applications.

One or more embodiments may rely on a standardized CAN FD physical interface and protocol and exploit differential bus wiring while providing a certain edge density for synchronization purposes.

One or more embodiments may implement cyclic redundancy check (CRC) and error checking for safety compliance.

Figure 1:
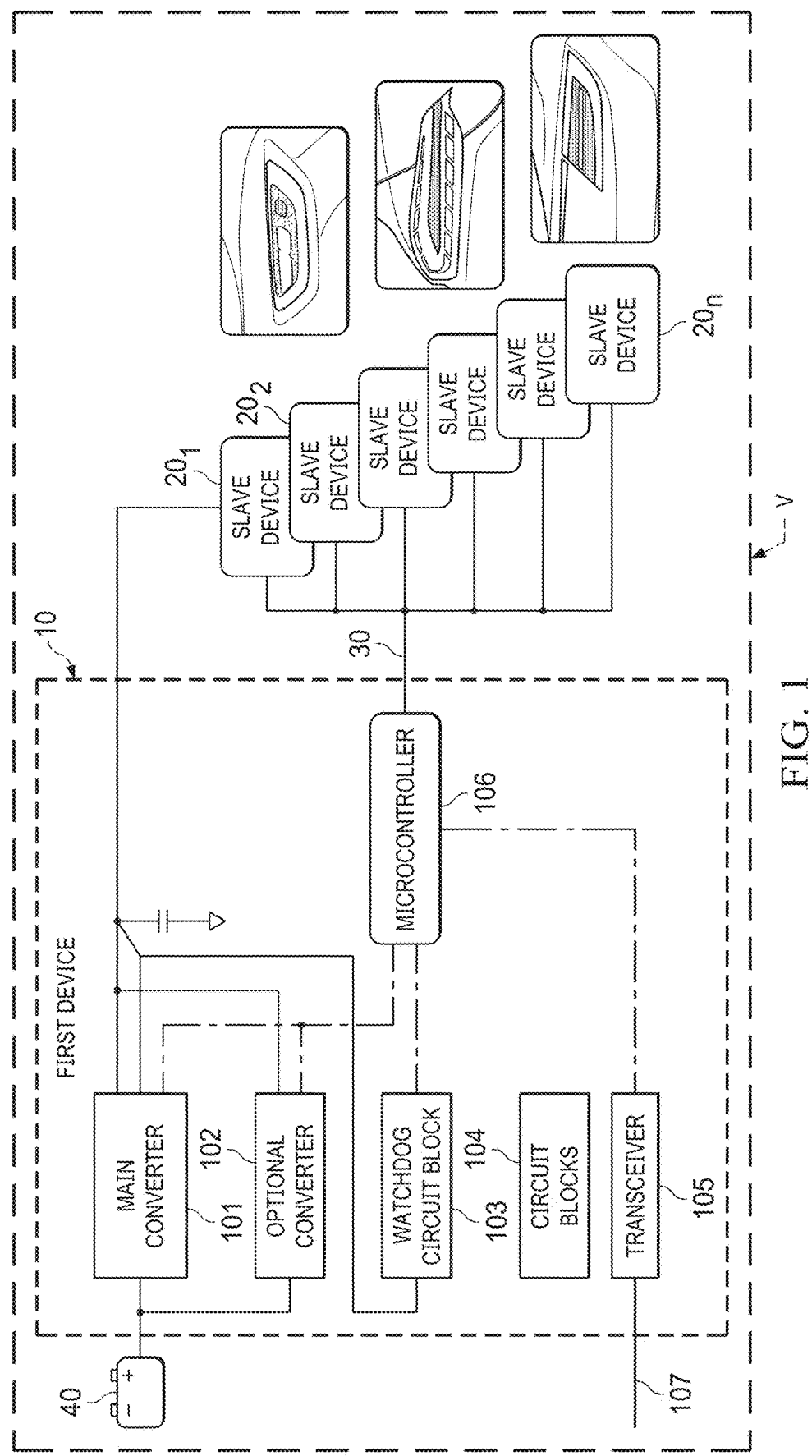
FIG. 1 is exemplary of a possible implementation of embodiments.

The diagram of FIG. 1 is generally exemplary of an arrangement wherein a first device 10 and a set of second devices $20_1, 20_2, \ldots, 20_n$, e.g., on board of a vehicle V, are coupled via a bus 30. For instance, the bus 30 may be a differential bus. A CAN bus is exemplary of such possible differential bus.

In such an arrangement as exemplified in FIG. 1, the first device 10 transmits over the bus 30 "first" messages carrying a set of operation data message portions, and the second devices in the set of second devices $20_1, 20_2, \ldots, 20_n$, identify in the first messages respective operation data message portions addressed to them and react thereon by implementing respective operations.

As exemplified in FIG. 1, one or more embodiments may be applied to local communication bus networks, e.g., for driving LED clusters (e.g., lights of a vehicle). In case such bus networks are compatible with standard CAN FD networks, they are herein referred to as "CAN FD Light" networks.

It will be otherwise appreciated that reference to such possible application is for exemplary purposes only and is not to be construed (even indirectly) as limiting the embodiments.

For instance, a communication system as exemplified in FIG. 1 may be suitable also for use with drivers for front lights and/or interior lights of a vehicle.

Similar communication systems may be suitable for use with any other type of ECUs and drivers (not necessarily within a vehicle), provided that they can rely on a master-slave architecture.

FIG. 1 is exemplary of a system according to embodiments comprising a master device 10, e.g., an electronic control unit (ECU) for, e.g., LED clusters in rear lights in a vehicle.

It is again stressed that reference to such possible application is for exemplary purposes only and is not to be construed (even indirectly) as limiting the embodiments.

One or more embodiments may include a plurality of "satellites" or slave devices $20_1, 20_2, \ldots, 20_n$, e.g., (linear) LED driving circuits communicating with the master device, through a communication bus 30.

In one or more embodiments, both the master device 10 and the slave devices $20_1, 20_2, \ldots, 20_n$, may be supplied with power from a power source 40, e.g., a battery provided within the vehicle.

In one or more embodiments, the master device 10 and the slave devices $20_1, 20_2, \ldots, 20_n$ may be referred to different grounds.

A master device 10 as illustrated in FIG. 1 may comprise one or more of the following components: a main (e.g., "buck") converter 101, an optional (e.g., again "buck") converter 102, a low-dropout (LDO) linear voltage regulator, stand by, reset and window, and watchdog circuit block 103, voltage supervisor, power good, oscillator and enable circuit blocks 104, a microcontroller 106, a transceiver circuit 105 for communication with other ECUs possibly mounted in the vehicle (e.g., a LIN2.2/HS-CAN transceiver), and an access point to an external communication bus 107 connected to the transceiver 105 for communication with other ECUs comprised in the vehicle.

In one or more embodiments, the microcontroller 106 may be supplied from the main converter 101 and/or from the optional converter 102. The microcontroller 106 may be coupled with the circuit block 103 and with the transceiver 105, and may be adapted for communication and/or cooperation with the communication bus 30.

Other than for the aspects discussed in the following, such an architecture for the master device 10 is conventional in the art, thus making it unnecessary to provide a more detailed description herein.

In one or more embodiments, the "master" functionality of the device 10 may be implemented using a protocol controller embedded in the microcontroller 106 and a CAN FD transceiver (not visible in FIG. 1).

For instance, in one or more embodiments as exemplified herein, the master 10 is a microcontroller (μC) that handles bus communication. Such a microcontroller may use an embedded CAN FD protocol controller that can handle the CAN FD protocol without the intervention of software. This may be a preferable choice over running via SW a different controller that would occupy the resources of a microcontroller core and may be undesirably slow. One or more embodiments thus facilitate reusing an existing hardware protocol controller, with CAN FD messages sent and their content controlled by software.

In one or more embodiments, the slave devices 20 may be implemented as LED drivers using BCD (BIPOLAR-CMOS-DMOS) technology.

In one or more embodiments, data exchange on the communication bus 30 may rely on a master-slave scheme, wherein the slaves $20_1, 20_2, \ldots, 20_n$, may send data over the communication bus 30 (only) upon request from a master device 10.

As noted, in one or more embodiments such an operating scheme may not involve a collision-resolving feature, insofar as normal operation may aim at avoiding collisions, with collisions treated as errors. Normal operation of the communication bus 30 may involve the master 10 sending regularly (i.e., in defined time intervals) data to the slaves $20_1, 20_2, \ldots, 20_n$ with such data received by (all) the slaves $20_1, 20_2, \ldots, 20_n$. Such a regular data stream may be used by the slaves as network "heartbeat" or watchdog. As a result of the regular data stream not being received within a defined time slot, the slaves can enter their fail-safe (or limp-home) mode.

In one or more embodiments, data such as diagnosis data from the slaves $20_1, 20_2, \ldots, 20_n$, may be requested by the master 10 by using dedicated command frames, e.g., "second" messages sent by the master 10 over the bus 30. A certain (one) addressed slave $20_i$ may react, e.g., answer a request issued by the master within a certain time frame. Such an answer, sent by the slave $20_i$ over the bus network 30, can be used by the master 10 to detect the availability and/or the correct operation of the slave $20j$.

It will be appreciated that the first messages discussed herein essentially correspond to broadcast messages as conventionally transmitted in a message-based protocol such as, e.g., a CAN bus protocol where messages transmitted over the bus by one device are (simultaneously) received by (all) the other devices, with these latter devices capable of implementing respective operations as a function of operation data portions conveyed by such broadcast messages. While so-to-say "physically" broadcast over the bus by one (master) device, the second messages are in fact "logically" addressed to individual ones of the other (slave) devices essentially as request messages whereby the slave devices are requested to react by sending towards the master device—within a certain time interval-a respective response such as e.g., a diagnostic message, with possible collisions of such responses avoided insofar as the master device allots respective, non-colliding, response intervals to the slave devices.

It will also be noted that, in the framework of the present description, both the terms "frame" and "message" may be used to indicate messages exchanged amongst participants in the communication bus 30.

In one or more embodiments, the communication protocol may use (only) CAN FD format frames, without bit rate switching and with standard ID.

Extensions like supporting extended ID, classic CAN frames or bit rate switching may be optionally included. Frames that are not supported by the implementation can be ignored, with bits intended for changing these operation modes kept at their fixed value.

Figure 2:
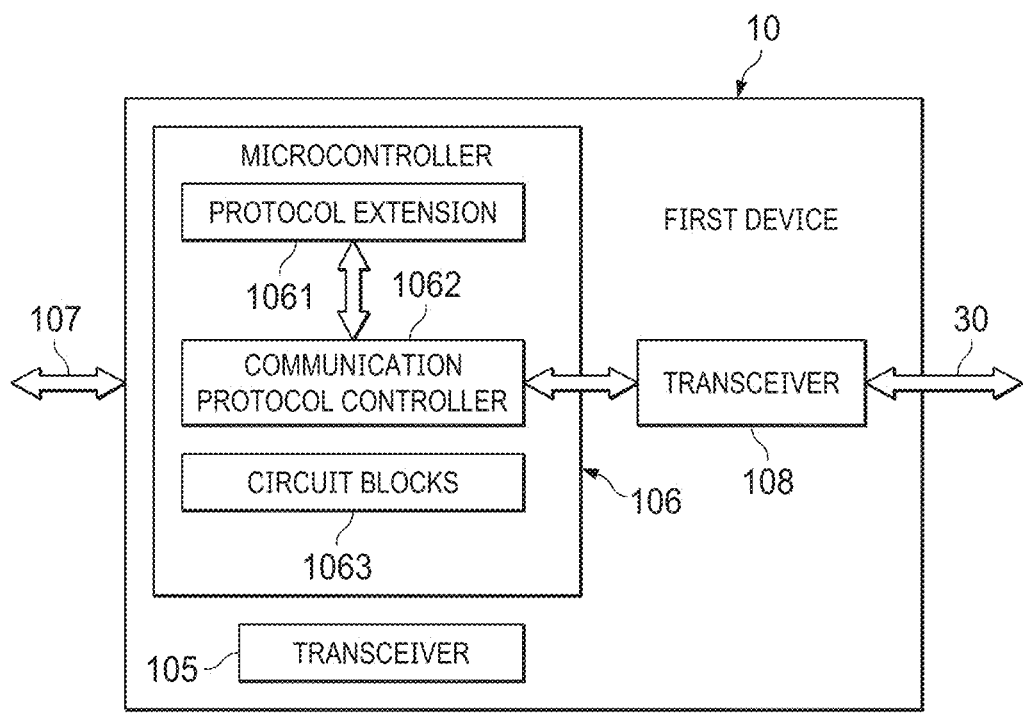
FIG. 2 is exemplary of a possible implementation of a master device in embodiments.

FIG. 2 is a block diagram exemplary of a possible implementation of a master device 10 according to embodiments.

Throughout the figures annexed herein, like parts or elements are indicated with like references/numerals and a corresponding description will not be repeated for brevity.

Therefore, FIG. 2 shows a master device 10 which may comprise an access point to a communication bus 30, e.g., a CAN bus, an access point to a second communication bus 107, a transceiver circuit 105 for cooperation with the communication bus 107, a transceiver circuit 108, e.g., a CAN FD transceiver, for cooperation with the communication bus 30, and a microcontroller 106, in turn comprising a (HW and/or SW) communication protocol controller 1062, e.g., a CAN FD protocol controller, a communication protocol extension (e.g., SW) 1061, e.g., a "CAN FD Light" protocol extension, and possibly other circuit blocks 1063.

In one or more embodiments, an additional CAN FD protocol extension 1061 may control the CAN FD protocol controller 1062 for implementing the master side of the CAN FD Light protocol as exemplified herein.

In one or more embodiments, access to the physical interface of the bus 30 may be provided by using an otherwise conventional CAN FD transceiver 108.

Figure 3:
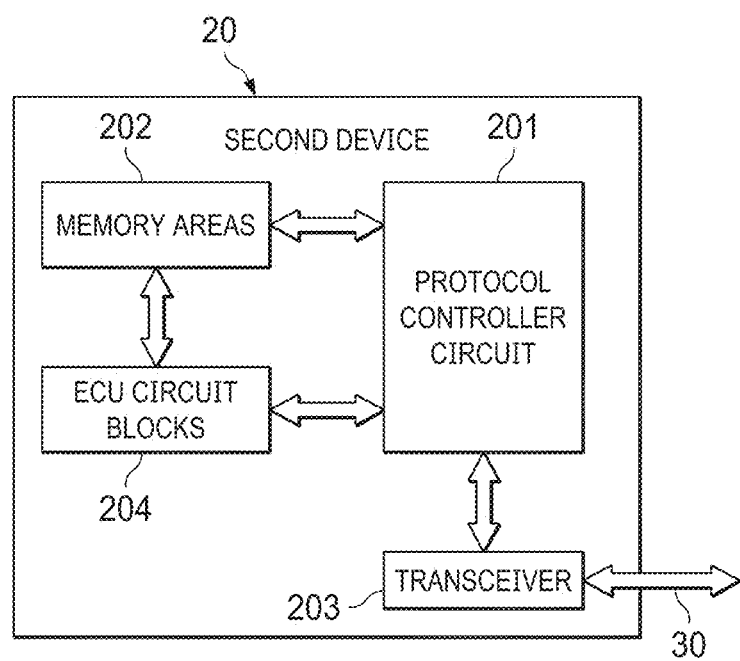
FIG. 3 is exemplary of a possible implementation of a slave device in embodiments.

FIG. 3 is a block diagram exemplary of a possible implementation of a slave device $20_i$ according to embodiments.

As exemplified in FIG. 3, a slave device $20_i$ may comprise a communication and protocol controller circuit 201, e.g., a "CAN FD Light" communication and protocol controller, memory areas 202, a transceiver 203, e.g., a CAN FD transceiver, for cooperation with the communication bus 30, and possibly other ECU circuit blocks 204.

Other than for the aspects discussed in the following, such an architecture for the slave devices $20_i$ is conventional in the art, thus making it unnecessary to provide a more detailed description herein.

For instance, in one or more embodiments, the implementation of the communication and protocol controller circuit 201 may be by means of application-specific hardware to reduce the necessity of embedded processors for running software.

In one or more embodiments, the communication and protocol controller circuit 201 may comprise an accurate oscillator (not visible in FIG. 3) for use in generating and sampling the data bits.

Figure 4:
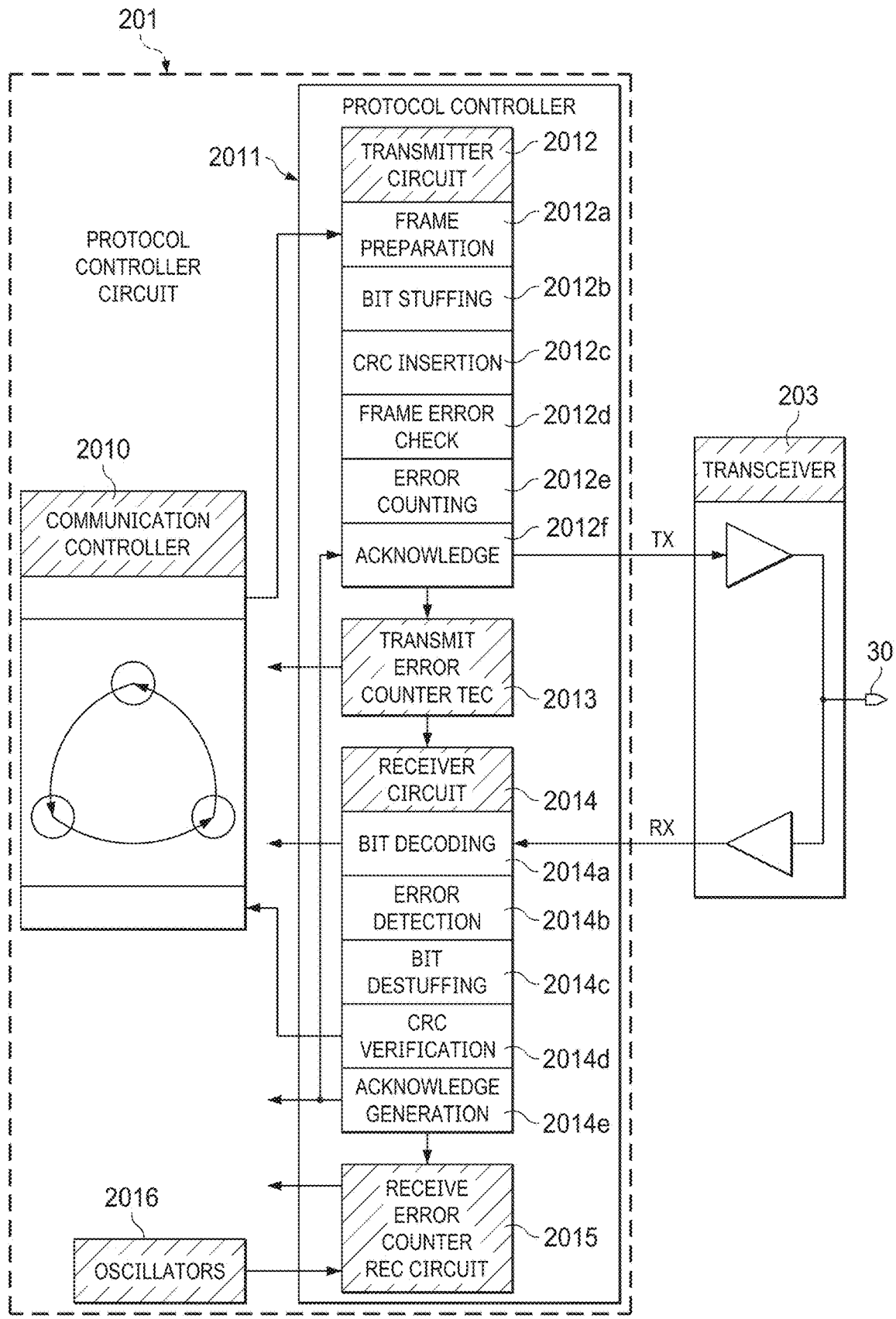
FIG. 4 is a diagram exemplary of a possible operation of embodiments.

FIG. 4 is a diagram exemplary of a possible operation of a communication and protocol controller circuit 201, e.g., a CAN FD Light communication and protocol controller circuit.

A communication and protocol controller 201 as exemplified in FIG. 4 comprises a communication controller 2010, a protocol controller 2011, in turn comprising a transmitter circuit 2012, a Transmit Error Counter (TEC) circuit 2013, a receiver circuit 2014 and a Receive Error Counter (REC) circuit 2015, and an oscillator 2016, optionally of a voltage, process and temperature compensated type and/or correspondingly trimmed.

In one or more embodiments, the transmitter circuit 2012 and/or the receiver circuit 2014 may be configured to cooperate with the transceiver 203, e.g., a CAN FD transceiver, for communication over the bus 30.

In one or more embodiments, the transmitter circuit 2012 may be configured to perform frame preparation (2012*a*), bit stuffing (2012*b*), CRC insertion (2012*c*), frame error check (2012*d*), error counting (2012*e*) and acknowledge (2012*f*).

In one or more embodiments, the receiver circuit 2014 may be configured to perform bit decoding (sampling—2014*a*), error detection (2014*b*), bit destuffing (2014*c*), CRC verification (2014*d*) and acknowledge generation (2014*e*).

In one or more embodiments, the communication controller 2010 may send and receive data to and from the protocol controller 2011 to control the communication.

In one or more embodiments, applying a master-slave architecture to a CAN FD based communication bus 30 may provide the possibility of exploiting the advantages of the CAN FD protocol (e.g., high data rate, robust differential signaling, CRC for safety purposes) while overcoming its drawbacks, for instance the requirement of an accurate clock timing for multilateral communication (e.g., for arbitration, error signaling, frame check by every ECU), the high complexity, and the absence of guaranteed communication slots due to the absence of a central communication master.

In one or more embodiments as exemplified herein, high bandwidth (e.g., 500 kb/s, preferably 1 Mb/s) may be employed and the communication may involve checking for ASIL B (Automotive Safety Integrity Level B) safety requirements. For instance, fulfilling such safety requirements may be facilitated by a CRC value that is sent with each data frame.

In one or more embodiments as exemplified herein, as a result of receiving a data frame, e.g., a "first" message sent by the master 10 over the bus 30, the recipients (slaves $20_1$, $20_2$, ..., $20_n$) send an "acknowledge" bit so that at least one acknowledge bit is received by the sender (master 10) if the system operates correctly.

Therefore, as a result of receiving at least one acknowledge bit from the slaves $20_1$, $20_2$, ..., $20_n$, the master 10 can detect if it is still coupled to the bus network 30. Since the participants of the bus network 30 are connected to a same wire, a transmitter may be able to detect if it is not correctly operating, and can consequently enter a "passive" state to not perturb the bus communication.

In one or more embodiments, a participant of the bus network 30 in a passive (e.g., recessive) state may be able to sense the value of the bus differential voltage but may not be able to drive the bus, that is it may not be able to force a certain value of the bus differential voltage.

In one or more embodiments, the data sampling clock may be generated in the receiver circuits individually. A minimum edge density of the data stream will thus be beneficial, e.g., with a recessive-to-dominant edge at least every e.g., 10th bit, thus facilitating a synchronization of the receiver circuit to the data stream.

In one or more embodiments, a differential bus network facilitates "robust" data transfer at low cost. In one or more embodiments, also a wake-up over the network may be implemented, and the slaves $20_1$, $20_2$, ..., $20_n$, may be woken up using a wake-up pattern (WUP) according to the ISO 11898-2:2015 standard, e.g., using a filter time $T_{filter}$ (short).

One or more embodiments may thus take advantage of a conventional CAN FD protocol, e.g., at 1 Mb/s, without bit rate switching for compatibility reasons. Therefore, compatibility may be sought by implementing (in an otherwise conventional CAN FD protocol controller) (only) a subset of features of a conventional CAN FD protocol (e.g., not implementing the bit rate switching feature).

A communication network as described herein lends itself to use with notionally any CAN and/or CAN FD protocol "flavors".

For instance, in one or more embodiments as exemplified herein:
- (only) the CAN FD Base Frame Format (FBFF) may be used, without having to resort to an extended ID, e.g., in order to increase the data payload of each frame (for instance, up to 64 bytes per frame);
- (only) one frame format (FBFF) may be supported, with the bits in the control field fixed and extended ID (EID, IDE bit always dominant), bit rate switch (BRS, always dominant) and error state indication (ESI, always dominant) not requiring to be supported: e.g., FD frame (FDF) may be (steadily) set to recessive.

In one or more embodiments, supporting (only) one frame format, e.g., the CAN FD Base Frame Format, may result in a simpler implementation and may facilitate cost reduction.

The data field in a CAN FD Base Frame Format can be up to 64 bytes long. Depending on the number of data bytes, either CRC17 or CRC21 may be calculated. In one or more embodiments, (only) one CRC delimiter bit may be sent and accepted.

In one or more embodiments, network participants 20 may comprise a receive error counter (REC) 2015 and a transmit error counter (TEC) 2013.

In one or more embodiments, as a result of the receive error counter 2015 in the network participant $20_i$ amongst the network participants $20_1$, $20_2$, ..., $20_n$, reaching a certain threshold, the coupling of the network participant $20_i$ to the communication bus 30 may be assumed to be lost.

In one or more embodiments, as a result of the transmit error counter in the network participant $20_i$ amongst the network participants $20_1$, $20_2$, ..., $20_n$, reaching a certain threshold, the node $20_i$ may stop sending data and enter a passive state (recessive state) to avoid perturbing the bus.

In one or more embodiments, the transmit error counter of any of the network participants $20_1$, $20_2$, ..., $20_n$ can be reset by a command from the master 10, which can be sent to a certain participant $20_i$ as a result of no data from node $20_i$ being received for a certain period of time. Receiving a reset command in a certain slave $20_i$ may unlock that slave, which may have entered into passive state due e.g., to some exceptional condition (e.g., distortion).

One or more embodiments may adopt REC/TEC insofar as these are (already) provided for in the CAN bus "de facto" standard.

A safety concept of one or more embodiments can be built on the master-slave protocol structure and operation involving sending of messages within a given time frame and the correctly receiving these messages.

One or more embodiments may contemplate circumstances as discussed in the following:
a. TEC threshold exceeded
  i. TEC in master: the master is aware of being no longer coupled to the slaves→a warning message is issued (e.g., to the driver: lamp, dashboard message, etc.)
  ii. TEC in slave: a certain slave is aware of its inability to send diagnostic messages to the master→enter fail-safe state ("limp-home"), e.g., LED backlight turned on
b. REC threshold exceeded
  i. REC in master: network "distorted" (e.g., shorted cables or other reasons)→master will send fail-safe commands to the slaves and issue a warning message (e.g., to the driver)

ii. REC in slave: network "distorted"→slaves will stop communication (thus will avoid the potential risk that the bus is blocking the communication of the other slaves) and enter the fail-safe state c. Master sends "first" message
  i. Master receives no acknowledge→TEC increases in master, with the same reaction discussed above
  ii. Slaves do not receive "first" messages in a given time frame→network distorted (same as REC failure in slaves, with the same reaction discussed above)

d. Master sends "second" message
  i. Master receives no acknowledge (ACK)→same reaction discussed above
  ii. Master does not receive an answer from the addressed slave→network distorted (at least at the slave concerned, with the same reaction discussed above)
  iii. Slave does not receive the "second" message→No action; communication is verified by the "first" messages, with the same reaction as discussed above in that respect e. Slave answers to a "second" message by sending a diagnosis frame
  i. Master does not receive the diagnosis frame within a certain time frame or receives a distorted answer-→network distorted (at least at the slave concerned, with the same reaction as discussed above for REC failure in master)
  ii. Slave does not receive an acknowledge: network distorted→same reaction as discussed above for TEC failure in slave; in the possible absence of TEC in slaves (see also below) no reaction is provided and communication is verified by the reception of "first" messages from the master.

As noted, one or more embodiments may contemplate "dropping" the REC/TEC concept for the slaves while retaining it (only) in the master, e.g., as a part of the original CAN (FD) protocol, so that (only) the master will evaluate its TEC/REC.

In one or more embodiments, in a fail-safe/limp-home situation, the slaves (e.g., the LED drivers of the backlights in a car) will enter a safe state, e.g., with the backlights (at least partly) turned on so the car can still be seen by other drivers in the dark, while discontinuing other ancillary functions that may increase power consumption, in order to avoid e.g., over-temperature or other failures.

Of course, the type and nature of a fail-safe/limp-home situation may vary as a function of the kind of slave involved: e.g., interior lights may be simply turned off to avoid annoyance of a driver during night driving.

In one or more embodiments, the master may also enter a fail-safe state if its network connection to the main controller (chassis/body controller, a higher level controller) through the bus 107 fails. As a result of the master entering a fail-safe state, the master may send a command to the slaves coupled therewith to enter respective fail-safe states. Also, the master may react to network distortions by alert messages, e.g., by informing the driver via warning lamp and/or dashboard messages.

In one or more embodiments, any sender may receive from at least one receiver an acknowledge ("ACK") bit as a result of the receiver receiving correctly a data frame. Therefore, the sender can identify if it is still coupled to at least a part of the network. For instance, the transmit error counter of the sender is increased as a result of no ACK bits being received by the sender.

For instance, in one or more embodiments as exemplified herein, the master 10 will send out messages in a regular time period that can be used as "watchdog trigger" and/or network "heartbeat". Therefore, the receiving slaves $20_1$, $20_2, \ldots, 20_n$, can recognize if the master 10 is communicating. The master 10 may request status information from each connecting slave 20 periodically. In case a slave $20_i$ amongst the slaves $20_1, 20_2, \ldots, 20_n$ does not answer to the status information request issued by the master 10, the "absence" (e.g., failure) of the slave $20_i$ can be detected.

For instance, in one or more embodiments as exemplified herein, any sender may be configured to compare the bits it sends over the communication bus 30 with the bits received on the bus 30. As a result of the bits sent and received being found not to be equal, the presence of an error may be assumed and the transmit error counter of the sender therefore increased. The sender node may stop transmitting data as a result of the corresponding TEC reaching a certain threshold, causing the sender to enter a passive state.

For instance, in one or more embodiments as exemplified herein, received frames may be verified for correctness, e.g., by checking one or more of the following features:
  the correctness of the received CRC,
  the receipt of one recessive bit as CRC delimiter following the CRC field,
  the correctness of the bit stuffing of the received frame.

In one or more embodiments, as a result of the received CRC failing to match the received frame, the received frame may be discarded and the REC of the receiver may be increased.

In one or more embodiments, as a result of the bit stuffing of the received frame being incorrect, the received frame may be discarded and the REC of the receiver may be increased.

In one or more embodiments, transmitted frames may be verified for correctness, e.g., by checking one or more of the following features:
  the equality between the bits sent and the bits received, since sent bits are also received by the transceiver circuit;
  the acknowledgment of transmitted frames by at least one receiver circuit, by issuing an ACK bit from at least one receiver.

In one or more embodiments, as a result of bits sent and the bits received being found not to be identical, the transmitted frame may be considered invalid, with transmission aborted and the TEC of the transmitter increased.

In one or more embodiments, as a result of the transmitter circuit failing to receive any ACK bit from the receivers, the transmitted frame may be considered as not received by any of the receivers, the TEC of the transmitter may be increased and the transmitted frame may not be resent.

In one or more embodiments, the oscillators 2016 of the slave devices $20_1, 20_2, \ldots, 20_n$, may have a maximum allowed deviation of their oscillation frequency, for instance ±2% of the expected value. Therefore, the maximum frequency offset between two slaves in one or more embodiments can reach a maximum value, for instance up to ±4% of the oscillation frequency.

In one or more embodiments, the frames sent by one slave may not be intended to be decoded by another slave on the same communication bus 30. As a result of a slave receiving a frame sent by another slave, the receive error counter of the first slave may increase. Error frames are not transmitted by the slaves, so the communication is not distorted.

Therefore, in one or more embodiments, the REC of a receiver may be decreased as a result of receiving an error-free frame, according to the length of such received frame, as exemplified in Table 1 in the following.

In one or more embodiments, the REC of a receiver may be decreased by one unit for Data Length Codes (DLC) up to 8, e.g., according to CAN Partial Networking (CAN PN), which works with the classic CAN Extended Frame Format (CEFF). In the case of longer frames, the REC may be decreased according to the number of classic CAN frame data payloads. In one or more embodiments, such behavior may be accounted for in the communication controller 2010 since many frames originating from slaves may not be recognized by the other slaves in the communication bus 30. In the worst case, (all of) the frames originating from slaves may not be recognized by the other slaves in the communication bus 30. Moreover, the REC of the receivers may be increased by more than one unit per received frame, since stuffing errors, CRC errors and CRC delimiter errors may add up.

In one or more embodiments, the master will send more 8-byte data packets for each slave response than the slave. In fact, in one or more embodiments, slave responses may be shorter (e.g., carrying a lower number of data bytes) than frames sent by the master.

In order to "compensate" for slave responses sent by one slave over the bus 30 leading to other slaves coupled to the bus 30 increasing their REC, long frames sent by a master being correctly received by slaves may decrease the REC of the slaves by an amount according to the length of the frame sent by the master, as exemplified in Table 1.

TABLE 1

DLC and REC update

| Frames | Data length code (DLC) | | | | Number Of Data Bytes | REC decrease | REC increase |
|---|---|---|---|---|---|---|---|
| | DLC3 | DLC2 | DLC1 | DLC0 | | | |
| Classical Frames and FD Frames | 0 | 0 | 0 | 0 | 0 | 1 | 1 |
| | 0 | 0 | 0 | 1 | 1 | | |
| | 0 | 0 | 1 | 0 | 2 | | |
| | 0 | 0 | 1 | 1 | 3 | | |
| | 0 | 1 | 0 | 0 | 4 | | |
| | 0 | 1 | 0 | 1 | 5 | | |
| | 0 | 1 | 1 | 0 | 6 | | |
| | 0 | 1 | 1 | 1 | 7 | | |
| | 1 | 0 | 0 | 0 | 8 | | |
| Classical Frames | 1 | 0 or 1 | 0 or 1 | 0 or 1 | 8 | 1 | |
| FD Frames | 1 | 0 | 0 | 1 | 12 | 2 | |
| | 1 | 0 | 1 | 0 | 16 | | |
| | 1 | 0 | 1 | 1 | 20 | 3 | |
| | 1 | 1 | 0 | 0 | 24 | | |
| | 1 | 1 | 0 | 1 | 32 | 4 | |
| | 1 | 1 | 1 | 0 | 48 | 6 | |
| | 1 | 1 | 1 | 1 | 64 | 8 | |

Figure 5:
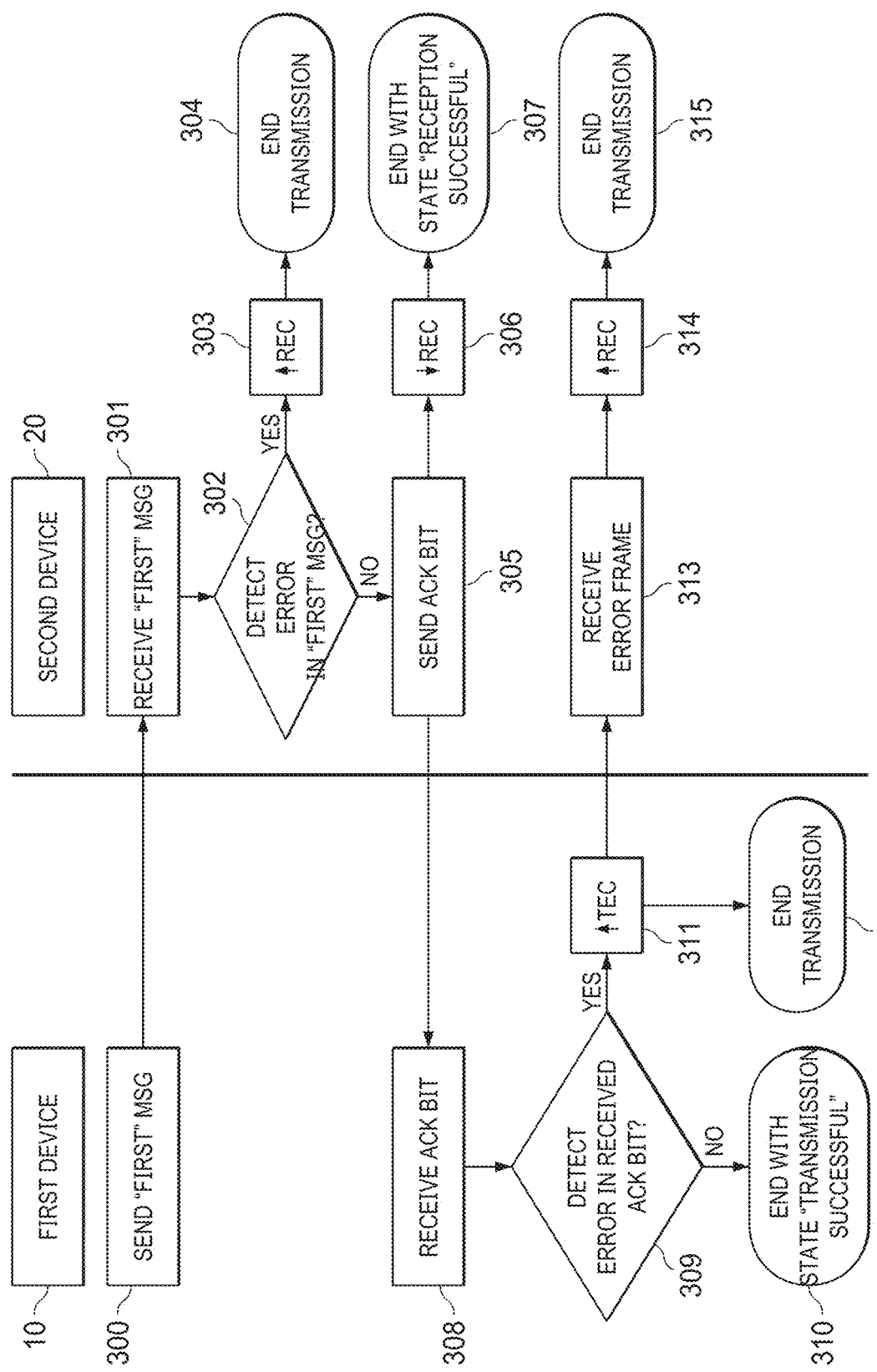
FIG. 5 is a block diagram exemplary of a possible operation of embodiments managing a "broadcast" frame.

FIG. 5 is a block diagram exemplary of a possible logic flow describing the "broadcast" frame protocol implemented in one or more embodiments, e.g., for a master sending a "first" message and a slave receiving such message.

In FIG. 5, the logic blocks that lie at the left of the thick vertical line are indicative of operations implemented in the master device 10, and the logic blocks that lie at the right of the thick vertical line are indicative of operations implemented in any slave device $20_i$ amongst the slave devices $20_1, 20_2, \ldots, 20_n$.

The meaning of the logic blocks in FIG. 5 is the following:

300: send "first" message with broadcast ID,

301: receive "first" message,

302: detect error in received "first" message (Y=error detected, N=error not detected),

303: increase REC of the slave upon positive (Y) outcome of block 302,

304: end transmission,

305: send ACK bit upon negative (N) outcome of block 302,

306: decrease REC of the slave,

307: end with state "reception successful",

308: receive ACK bit,

309: detect error in received ACK bit (Y=error detected, N=error not detected),

310: end with state "transmission successful" upon negative (N) outcome of block 309,

311: optionally increase TEC of the master, and send error frame upon positive (Y) outcome of block 309,

312: end transmission,

313: receive error frame,

314: increase REC of the slave,

315: end transmission.

The operation described by the block diagram of FIG. 5 is also briefly discussed in the following for the sake of ease of understanding.

As exemplified in FIG. 5, in one or more embodiments a "first" message may be transmitted from the master 10 to the slaves $20_1, 20_2, \ldots, 20_n$ to set operation values, for instance setting actuator values.

In one embodiment, a "first" message may contain the setting values for all the slaves $20_1, 20_2, \ldots, 20_n$ connected to the communication bus 30.

In another embodiment, a "first" message may contain the setting values for a subset of slaves amongst all the slaves $20_1, 20_2, \ldots, 20_n$ connected to the communication bus 30, e.g., even for a single slave amongst the slaves $20_1, 20_2, \ldots, 20_n$.

In one or more embodiments, the master 10 may not expect an answer back from the slaves $20_1, 20_2, \ldots, 20_n$, after sending a "first" message, but it may expect at least one acknowledge bit from at least one slave, e.g., in the CAN acknowledge slot.

In one or more embodiments as exemplified herein, as a result of the master 10 failing to receive any acknowledge bit from at least one slave e.g., in the CAN acknowledge slot, the master 10 will increase the value of its transmit error counter. In one or more embodiments, the master 10 may also send an error frame on the communication bus 30.

In one or more embodiments as exemplified herein, the slaves $20_1, 20_2, \ldots, 20_n$ may check the integrity of a received "first" message and send an acknowledge bit if the received "first" message is error-free, with the "first" message considered valid in such a case. In one or more embodiments, receiving an additional error frame will result in the receive error counter increasing without any additional reaction.

In one or more embodiments, the slaves $20_1, 20_2, \ldots, 20_n$ may pick the data from the "first" message which is valid for them. In one or more embodiments, "first" messages may carry a broadcast-ID, e.g., in the standard-ID field of a CAN message.

Figure 6:
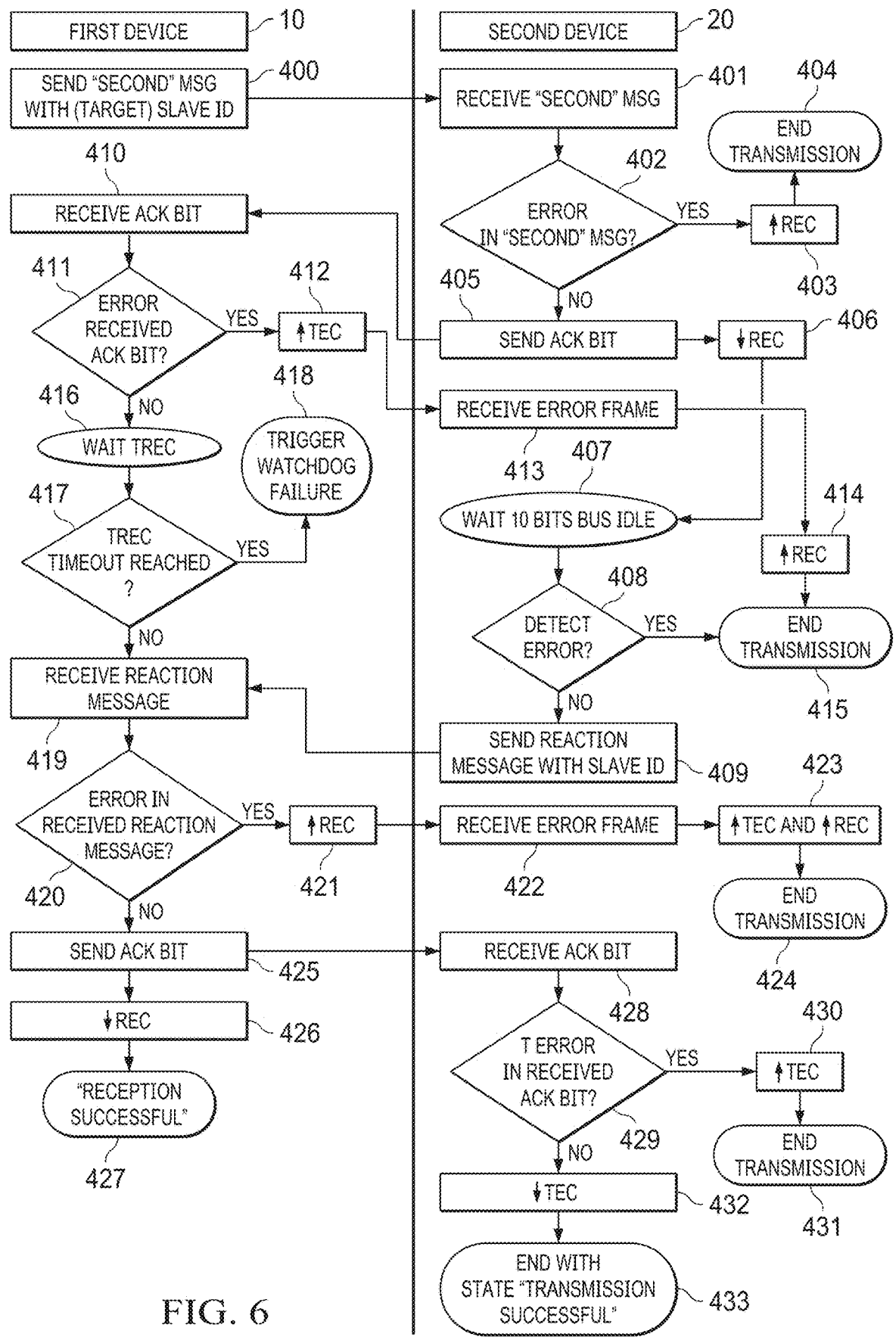
FIG. 6 is a block diagram exemplary of a possible operation of embodiments managing a "diagnosis" frame.

FIG. 6 is a block diagram exemplary of a possible logic flow describing the diagnosis frame protocol implemented in one or more embodiments e.g., for a master sending a "second" message and a slave receiving such message and reacting thereon.

As in FIG. 5, the logic blocks that lie at the left of the thick vertical line in FIG. 6 are indicative of operations implemented in the master device 10, and the logic blocks that lie at the right of the thick vertical line are indicative of operations implemented in any slave device $20_i$ amongst the slave devices $20_1, 20_2, \ldots, 20_n$.

The meaning of the logic blocks in FIG. 6 is the following:

400: send "second" message with (target) slave ID,
401: receive "second" message,
402: detect error in received "second" message (Y=error detected, N=error not detected),
403: increase REC of the slave upon positive (Y) outcome of block 402,
404: end transmission,
405: send ACK bit upon negative (N) outcome of block 402,
406: decrease REC of the slave,
407: wait 10 bits bus idle,
408: detect error (Y=error detected, N=error not detected),
409: send reaction message with slave ID,
410: receive ACK bit,
411: detect error in received ACK bit (Y=error detected, N=error not detected),
412: increase TEC of the master and send error frame upon positive (Y) outcome of block 411,
413: receive error frame,
414: increase REC of the slave,
415: end transmission,
416: wait TREC,
417: check if TREC timeout is reached (Y=TREC timeout reached, N=TREC timeout not reached),
418: trigger watchdog failure upon positive (Y) outcome of block 417,
419: receive reaction message upon negative (N) outcome of block 417,
420: detect error in received reaction message (Y=error detected, N=error not detected),
421: increase REC of the master and send error frame upon positive (Y) outcome of block 420,
422: receive error frame,
423: increase TEC and REC of the slave,
424: end transmission,
425: send ACK bit upon negative (N) outcome of block 420,
426: decrease REC of the master,
427: end with state "reception successful",
428: receive ACK bit,
429: detect error in received ACK bit (Y=error detected, N=error not detected),
430: increase TEC of the slave upon positive (Y) outcome of block 429,
431: end transmission,
432: decrease TEC of the slave upon negative (N) outcome of block 429,
433: end with state "transmission successful".

The operation described by the block diagram of FIG. 6 is also briefly discussed in the following for the sake of ease of understanding.

As exemplified in FIG. 6, in one or more embodiments the master 10 may send a "second" message to request diagnosis data from a certain slave $20_i$ amongst the slaves $20_1, 20_2, \ldots, 20_n$ connected to the communication bus 30 by including the identification slave ID of slave $20_i$ into the message ID, e.g., in the standard-ID field of a CAN message. The master 10 may wait for the answer, e.g., a reaction message, from the addressed slave within a specific time window TREC. As a result of the master 10 not receiving an answer within that time window TREC, a watchdog error may be triggered.

In one or more embodiments, as a result of correctly receiving a "second" message sent by the master 10 over the bus 30, the slave $20_i$ replies with an ACK bit in the ACK slot and sends its reaction message after waiting for a certain time interval, e.g., at least 10 bits of bus idle.

In one or more embodiments, other slaves amongst the slaves $20_1, 20_2, \ldots, 20_n$, may receive reaction messages incorrectly (e.g., due to the frequency offset of the respective oscillators with respect to the frequency of the master 10). As a result of incorrectly receiving such reaction messages, the RECs of the receiving slaves $20_1, 20_2, \ldots, 20_n$, may be increased.

In one or more embodiments as exemplified herein, slaves not addressed by the "second" messages issued by the master 10 will not answer and ignore the reaction messages sent by the addressed slaves.

In one or more embodiments as exemplified herein, frames will (only) be transmitted by the slaves $20_1, 20_2, \ldots, 20_n$, upon request from the master 10. Therefore, slaves $20_1, 20_2, \ldots, 20_n$ will not retransmit any frame in case of an error occurring.

In one or more embodiments as exemplified herein, "second" messages may be labeled by the ID of the addressed slave. Optionally, "second" messages can be labeled as broadcast frames by using unused ID bits in the standard-ID field (e.g., the lower 10 bits of the standard-ID field may denote the addressed slave while the 11th bit may mark the frame as a broadcast frame).

Figure 7:
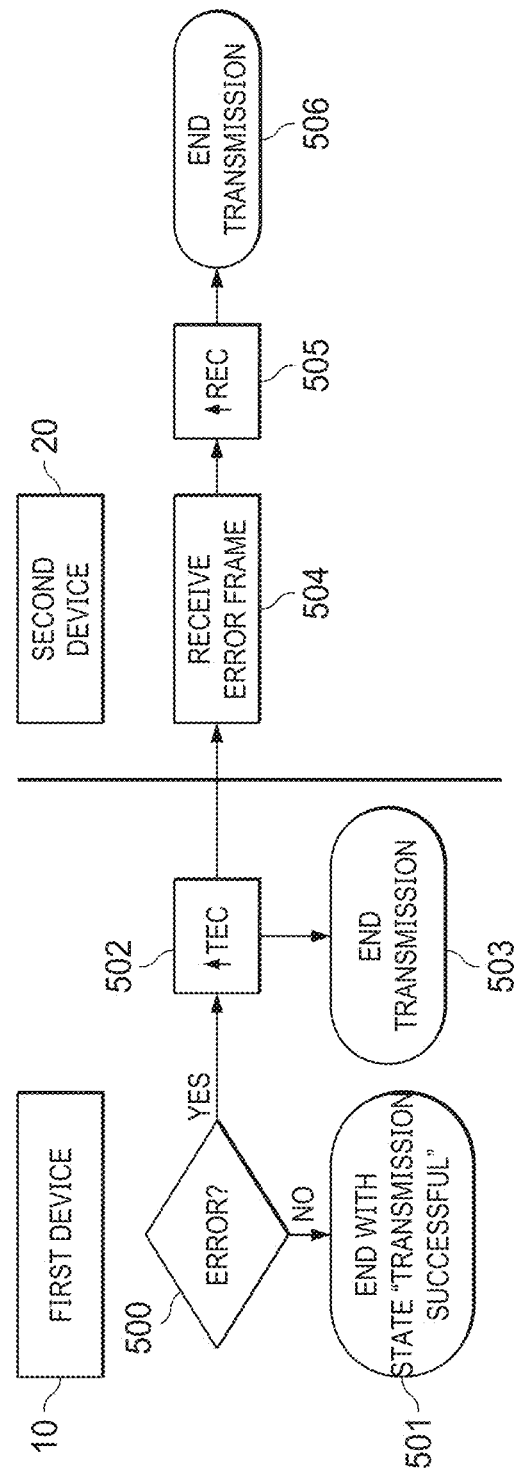
FIG. 7 is a block diagram exemplary of a possible operation of embodiments managing an "error" frame.

FIG. 7 is a block diagram exemplary of a possible logic flow describing the error and overload frame protocol implemented in one or more embodiments.

As in FIGS. 5 and 6, the logic blocks that lie at the left of the thick vertical line in FIG. 7 are indicative of operations implemented in the master device 10, and the logic blocks that lie at the right of the thick vertical line are indicative of operations implemented in any slave device $20_i$ amongst the slave devices $20_1, 20_2, \ldots, 20_n$.

The meaning of the logic blocks in FIG. 7 is the following:

500: detect error (Y=error detected, N=error not detected),
501: end with state "transmission successful" upon negative (N) outcome of block 500,
502: increase TEC of the master and send error frame upon positive (Y) outcome of block 500,
503: end transmission,
504: receive error frame,
505: increase REC of the slave,
506: end transmission.

The operation described by the block diagram of FIG. 7 is also briefly discussed in the following for the sake of ease of understanding.

In one or more embodiments, error frames are (only) sent by the master 10, not by the slaves $20_1, 20_2, \ldots, 20_n$. Receiving an error frame may lead the RECs of the slaves to increase by one. The same behavior may be applied in the case of overload frames, which are treated as error frames.

In one or more embodiments, the bus participants (slaves $20_1, 20_2, \ldots, 20_n$) may not arbitrate the communication on the bus 30, since the communication may be initiated and/or controlled (only) by the master 10.

In one or more embodiments as exemplified herein, any collision on the bus 30 will lead to an increase of an associated error counter. The master 10 may detect collisions as errors and increase its transmit error counter, without necessarily re-sending the frame. A slave amongst slaves $20_1, 20_2, \ldots, 20_n$ may detect wrong bits on the bus 30 (e.g., a dominant bit instead of an expected recessive) and increase its transmit error counter.

One may note that error messages are, so-to-say, error themselves, that is they may not comply with CAN protocol requirements. They may simply be a set of, e.g., six, dominant bits in a row. Thus they can be viewed as an error and dropped, with no reaction on the slave side to these.

A concept underlying one or more embodiments is to reset the watchdog timer (only) upon a correct reception of a "first" message and/or a "second" message, insofar as "first" messages and "second" messages are the (only) messages that are sent by the master.

Figure 8:
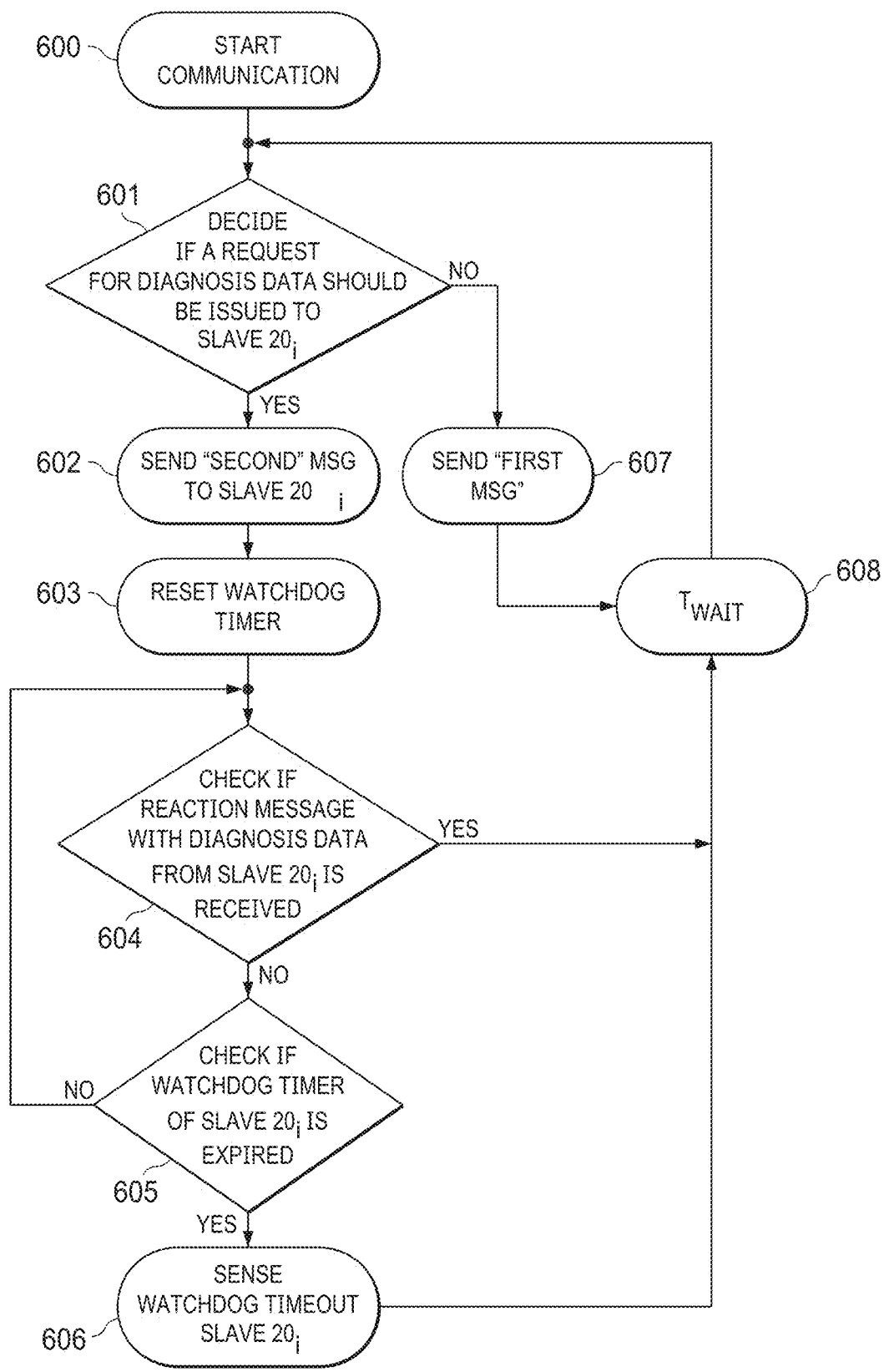
FIG. 8 is a block diagram exemplary of a possible implementation of a master communication cycle in embodiments.

FIG. 8 is a block diagram indicative of a possible implementation of a communication cycle of a master unit 10 in one or more embodiments.

The meaning of the logic blocks in FIG. 8 is the following:

600: start communication,
601: decide if a request for diagnosis data should be issued to slave $20_i$ (Y=issue diagnosis data request to slave $20i$, N=do not issue diagnosis data request to slave $20_i$),
602: send "second" message to slave $20_i$ upon positive (Y) outcome of block 601,
603: reset watchdog timer of slave $20i$,
604: check if reaction message with diagnosis data from slave $20_i$ is received (Y=diagnosis data received, N=diagnosis data not received),
605: check if watchdog timer of slave $20_i$ is expired (Y=watchdog expired, N=watchdog not expired),
606: sense watchdog timeout for slave $20i$, upon positive (Y) outcome of block 605,
607: send "first message", upon negative (N) outcome of block 601,
608: optionally wait for $T_{wait}$.

In one or more embodiments, the master 10 may send "first" messages, e.g., for actuator setting, (e.g., cyclically) to the slaves $20_1, 20_2, \ldots, 20_n$, which may use such a cycle as watchdog trigger. As a result of a "first" message not being received by a slave $20_i$ within the watchdog time, a watchdog timeout may be sensed. As a result of a watchdog timeout being sensed, the slave $20_i$ may enter a fail-safe state.

In one or more embodiments, the master 10 may request diagnosis data from a certain addressed slave $20_i$. As a result of the addressed slave $20_i$ not answering within a certain amount of time, a watchdog timeout may be triggered, so the master can act on a loss of communication with the slave $20_i$.

In one or more embodiments as exemplified herein, data can be sent to the slaves $20_1, 20_2, \ldots, 20_n$, in at least two different manners.

In a first case, a "first" message can be sent by the master 10 to all slaves $20_1, 20_2, \ldots, 20_n$. In such case, the master device 10 may not expect an answer from the slaves $20_1, 20_2, \ldots, 20_n$.

In a second case, a "second" message can be sent by the master 10 to a specific slave $20_i$. The slaves $20_1, 20_2, \ldots, 20_n$, may treat a "second" message as a broadcast frame, e.g., for actuator setting. (Only) the addressed slave can thus react on a "second" message by sending its diagnosis data back in a reaction message. Such diagnosis data will be ignored by the other slaves on the bus 30. Due to the frequency offset between the slaves, the reaction message sent by one of the slaves may be seen as an erroneous frame by the other slaves and may lead to an increase of their respective RECs.

In one or more embodiments, the "second" message may also be a dedicated frame which may be ignored by the other slaves.

In one or more embodiments, "first" messages may use a specified broadcast ID and "second" messages may contain the ID of the addressed slave.

In one or more embodiments, the remaining bits available in the standard ID field may be used to distinguish between a diagnosis request sending data to the slaves and a specific request to the addressed slave only.

Figure 9:
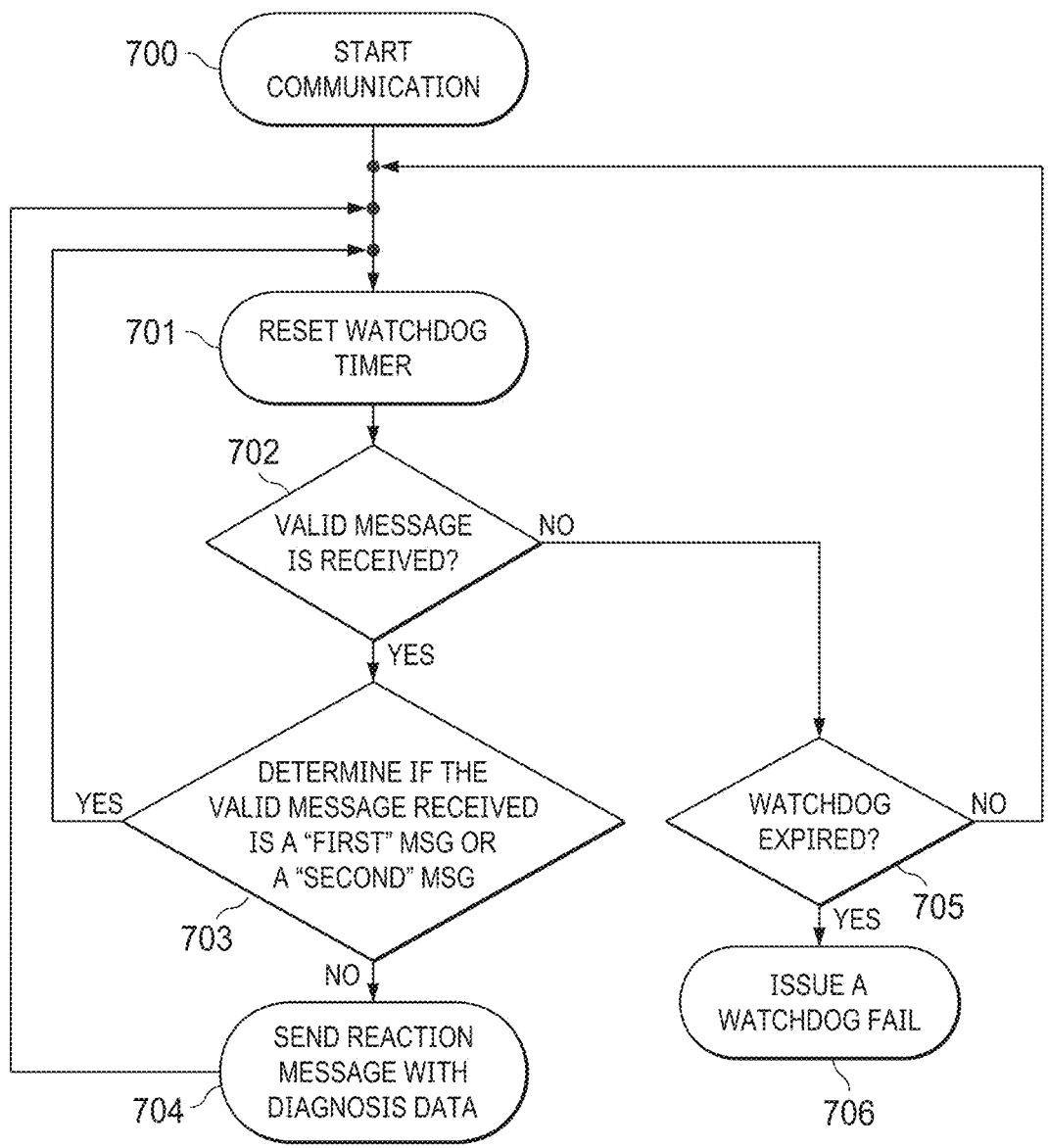
FIG. 9 is a block diagram exemplary of a possible implementation of a slave communication cycle in embodiments.

FIG. 9 is a block diagram indicative of a possible implementation of a communication cycle of the slave units $20_1, 20_2, \ldots, 20_n$ in one or more embodiments.

The meaning of the logic blocks in FIG. 9 is the following:

700: start communication,
701: reset watchdog timer,
702: detect if a valid message is received (Y=valid message received, N=no valid message received),
703: determine if the valid message received is a "first" message or a "second" message, upon positive (Y) outcome of block 702 (Y="first" message received, N="second" message received),
704: send reaction message with diagnosis data upon negative (N) outcome of block 703,
705: check if watchdog has expired, upon negative (N) outcome of block 702 (Y=watchdog expired, N=watchdog not expired),
706: issue a watchdog fail, upon positive (Y) outcome of block 705.

In one or more embodiments, the master 10 sends data to the slaves $20_1, 20_2, \ldots, 20_n$ (e.g., cyclically). Such data may be used by the slaves to reset respective watchdogs. In case no frame intended for resetting the respective watchdog is received by a slave before the watchdog expires, a watchdog fail may be set. Such watchdog fail may be used by the slave to enter a fail-safe state.

In one or more embodiments, as a result of a slave $20_i$ receiving a "second" message addressed thereto, a receiving slave $20_i$ will answer by sending a reaction message containing the requested diagnosis data.

In one or more embodiments, a master 10 may send e.g., 64 bytes (i.e. 512 bits, one byte being equal to 8 bits) of data in a single data frame. The bus participants, e.g., the slaves $20_1, 20_2, \ldots, 20_n$, will receive such data sent from the master 10. Therefore, a slave may "pick" the information it needs from any set of the 512 bits of data received from the master 10. This kind of frame is called a "first" message.

The number of bits that a slave may read in a certain "first" message may vary depending on the specific embodiment of the communication bus. The position of the data of a certain slave may be determined during an initialization sequence.

For instance, each slave may read 8 bits of data in a "first" message. If the total amount of data sent by the master 10 in a certain "first" message is equal to, e.g., 64 bytes (i.e. 512 bits), up to 64 slaves can be provided with data per "first" message. Once the amount of data sent by the master 10 in a "first" message as well as the amount of data read by the slaves in a "first" message are defined, a maximum number of slaves addressable by a "first" message can be correspondingly defined.

In one or more embodiments, the number of possible bus participants (i.e. the number of slaves) may be increased by providing "chains" of slaves. In that case, a first "first" message may address a first chain of slaves (comprising, e.g., 64 slaves), a second "first" message may address a second chain of slaves, and so on. The slave chains may be addressed by a dedicated ID in the message ID field, e.g., a CAN FD ID field.

In one or more embodiments, a slave may be addressed individually by using its slave address and the addressed slave will react on this diagnosis request frame.

In one or more embodiments, embedding a protocol such as, e.g., the ST SPI (Serial Peripheral Interface) 4.1 protocol developed by companies of the ST Group into the data of the "second" messages sent by the master 10 and reaction messages sent by the slaves $20_1, 20_2, \ldots, 20_n$, will facilitate reading or writing certain data to certain addresses.

In one or more embodiments, an SPI command according to the ST SPI protocol embedded into the data of the "second" message from the master may consist of a memory address and a number of data bytes for the request (read/write). The slave may respond according to the ST SPI protocol with a specific byte instead of the address and the data bytes of the requested memory address. Such specific byte is called the "global status byte" (GSB) and contains important status bits, such status bits being indicative of, e.g., an error occurred, a reset occurred, etc. Therefore, the global status register may be sent back with every diagnosis response.

In one or more embodiments, "first" messages are transmitted by the master 10 to (all) slaves $20_1, 20_2, \ldots, 20_n$, in the bus network 30. The ID field of a "first" message may contain the identification number of a chain that is addressed by the "first" message. Slaves belonging to the addressed chain may pick their data from the data transferred by the frame (e.g., a maximum of 64 bytes of data). The number of data bits read by a slave will be defined at the implementation of the function (e.g., being a so-called "hard-coded" value). The position of the data directed to a certain slave of an addressed chain in the overall data field of a "first" message may be determined during the chain initialization.

In one or more embodiments, a "first" message may use, for instance, an 11-bit frame ID starting with '1' followed by three '1's and the addressed chain identification number, e.g., a 7-bit number. For example, using chain identification numbers encoded in e.g., five bits allows the identification and assignment of up to 64 slave chains, with each chain comprising, e.g., up to 63 slaves.

In one or more embodiments, a specific "first" message, herein called "initialization frame", may be sent to the slaves $20_1, 20_2, \ldots, 20_n$, in the communication bus 30 to set their "membership" in a certain chain and their relative positions within the chain. As a result of receiving an initialization frame, the slaves will be put in a condition to read the data intended for them from the broadcast frames received over the communication bus 30. For instance, the number of bits read by a slave in a certain "first" message may be the same for all the slaves and defined at the bus implementation (e.g., a hard-coded value).

In one or more embodiments, the ID for a chain initialization frame may be, e.g., "1_0110_0000_00".

In one or more embodiments, a slave may read e.g., three bytes of data from an initialization frame, for instance the first byte being indicative of the chain it belongs to, the second byte being indicative of its position inside the chain, and the third byte being indicative of the addressed slave. Therefore, a single initialization frame may be used to initialize a limited number of slaves, depending on the dimension in bytes of the data field of the initialization frame and on the amount of data needed by a slave to be properly initialized. For instance, if the data field of the initialization frame is e.g., 64 bytes long and a slave needs e.g., 3 bytes of data for being correctly initialized, up to 21 slaves can be initialized in one CAN FD frame.

In one or more embodiments, a wake-up pattern (WUP) may be implemented as a specific "first" message. The ID of a wake-up pattern may be selected to satisfy the wake-up pattern requirements of ISO11898-2, e.g., with $T_{Filter}$(short) at 1 Mb/s. In case the communication bus is operated at lower bit rates, $T_{Filter}$(long) may be used.

In one or more embodiments, the reserved WUP ID may be "1_000_111_0000". The WUP may be repeated or enhanced in the optional data bytes of the wake-up frame.

In one or more embodiments, a master 10 may request data from a particular slave $20_i$ by sending a "second" message, which can be selected to be a CAN FD frame. The CAN FD ID of a "second" message may contain the slave ID, e.g., a 9-bit slave ID, as well as a bit identifying such frame as a "second" message and a bit identifying such frame as unicast frame.

In one or more embodiments, the Most Significant Bit (MSB) of the CAN FD IDs used in the bus 30 may be equal to "0" if identifying a so-called "unicast" frame, i.e. a frame addressed to a certain slave only, and equal to "1" if identifying a so-called "broadcast" frame, i.e. a frame addresses to all slaves, there comprising also chain initialization frames and wake-up frames. It will be appreciated that referring to "1" and "0" values, respectively, is merely by way of example: one or more embodiments may in fact adopt a complementary choice (e.g., "0" and "1" values, respectively).

In one or more embodiments, as a result of a unicast frame not containing any data, the addressed slave may transmit the default diagnosis data, as defined at implementation. Otherwise, in case a unicast frame contains data, such data will be an SPI command according to ST SPI 4.1 protocol.

In one or more embodiments, a slave receiving a unicast frame containing an SPI command as defined above will reply with the data requested by the "second" message encoded by the ST SPI 4.1 protocol.

In one or more embodiments, a master 10 may address a slave $20_i$ by sending a frame which contains the slave ID in the CAN FD ID field. The optional data bytes may contain an ST SPI SDI (ST Serial Peripheral Interface Serial Data Input) frame.

In one or more embodiments, a slave $20_i$ may answer to a received "second" message by sending a reaction message, e.g., a diagnosis response frame, over the communication bus 30. The reaction message can be selected to be a CAN FD frame. The CAN FD ID of a reaction message may contain the slave ID, e.g., a 9-bit slave ID, as well as a bit identifying such frame as a reaction message and a bit identifying such frame as unicast frame.

In one or more embodiments, the data bytes of a reaction message may contain an ST SPI SDO (Serial Peripheral Interface Serial Data Output as developed by companies of the ST Group) frame. In case the "second" message received by a slave does not contain data in the frame data field, the slave may answer to the received "second" message with a CAN FD frame whose data bytes may contain the Global Status Byte (GSB) only.

In one or more embodiments, different default replies may be used and specified in the device datasheet.

Possible uses of the frame ID, e.g., a CAN FD standard frame ID, in embodiments are exemplarily shown in Table 2 below.

TABLE 2

Frame ID Overview

| Frame ID[10:0] | Frame Name | Purpose | Remark |
|---|---|---|---|
| {0,0,Slave ID[8:0]} | Unicast Frame | Master: Diagnosis request | Optional ST SPI Protocol in data field |
| {0,1,Slave ID[8:0]} | Unicast Frame | Slave: Diagnosis response | Optional ST SPI Protocol in data field |
| "1_0110_0000_00" | Chain Init | Chain Initialization | Chain number, position and associated slave ID in data field |
| {1,111,chain#[6:0]} | Broadcast Frame | Send broadcast data to a certain chain | Chain members may pick their data from the data field |
| "1_000_111_0000" | Wake-Up Pattern | Broadcast data frame for waking up the slaves | Additional wake-up pattern may be sent in the data field |

In one or more embodiments, a protocol controller may implement the CAN FD protocol as previously described.

In one or more embodiments, building blocks for implementing CAN FD Wake-Up-Frame detection may be used and modified for facilitating the implementation of a simplified master/slave communication structure, wherein the slaves answer (only) on request by the master.

As already noted, the "first" messages discussed throughout this description essentially correspond to broadcast messages as conventionally transmitted in a message-based protocol such as, e.g., a CAN bus protocol where messages transmitted over the bus by one device are (simultaneously) received by (all) the other devices, with these latter devices capable of implementing respective operations as a function of operation data portions conveyed by such broadcast messages. Similarly, while so-to-say "physically" broadcast over the bus by one (master) device, the second messages discussed throughout this description are in fact "logically" addressed to individual ones of the other (slave) devices essentially as request messages whereby the slave devices are requested to react by sending towards the master device—within a certain time interval—a respective response such as e.g., a diagnostic message, with possible collisions of such responses avoided insofar as the master device allots respective, non-colliding, response intervals to the slave devices.

The first messages may thus be regarded as true "broadcast" messages; conversely, while physically broadcast over the bus 30 by one (master) device, the second messages may be regarded essentially as "unicast" messages, insofar as they are logically addressed to individual ones of the slave devices.

In one or more embodiments, a method may comprise:
coupling a first device (e.g., 10) and a set of second devices (e.g., $20_1$, $20_2$, ..., $20_n$) via a bus (e.g., 30),
configuring the first device as a master device to transmit over the bus:
a) first messages carrying a set of operation data message portions indicative of operations for implementation by second devices in the set of second devices, and
b) second messages addressed to second devices in the set of second devices, the second messages conveying identifiers identifying respective ones of the second devices to which the second messages are addressed requesting respective reactions towards the first device within respective expected reaction intervals, and configuring the second devices as slave devices:
c) to receive over the bus the first messages transmitted from the first device configured as master device, read respective operation data message portions in the set of operation data message portions and implement respective operations as a function of the respective operation data message portions read,
d) to receive over the bus the second messages transmitted from the first device configured as master device and react thereon within the respective expected reaction intervals by transmitting over the bus reaction messages towards the first device configured as master device.

In one or more embodiments, a first device configured as master device may transmit over a bus initialization messages comprising initialization data indicative of which operation data message portions in first messages transmitted over the bus from the first device configured as master device are dedicated to respective ones of second devices configured as slave devices, and second devices configured as slave devices may receive the initialization messages transmitted over the bus from the first device configured as master device and may initialize as a function of the initialization data to read respective operation data message portions dedicated thereto in the set of operation data message portions.

In one or more embodiments, a method may comprise arranging second devices in a set of second devices configured as slave devices in subsets of second devices, wherein a first device configured as master device may transmit over a bus first messages comprising subset identification indexes identifying the subsets of the second devices to which first operation messages are dedicated.

In one or more embodiments, a first device configured as master device may transmit first messages over a bus at a constant rate.

In one or more embodiments, second devices in a set of second devices may switch to a fail-safe state as a result of expiration of respective watchdog timers.

In one or more embodiments, second devices in a set of second devices may reset respective watchdog timers as a result of receiving from a first device configured as master device messages selected out of first messages and second messages.

In one or more embodiments, a first device may be sensitive to respective reactions requested from second devices in a set of second devices failing to reach the first device within respective expected reaction intervals, and/or may trigger respective watchdog error signals indicative of second devices in a set of second devices from which respective reactions fail to reach the first device within respective expected reaction intervals.

In one or more embodiments, a bus may comprise a differential wiring bus.

In one or more embodiments, a system may comprise a first device (e.g., 10) and a set of second devices (e.g., $20_1$, $20_2$, ..., $20_n$) coupled via a bus (e.g., 30), wherein the first device and the second devices may be configured as master device and slave devices, respectively, and the master device and the slave devices may be configured to operate with the method of one or more embodiments.

In one or more embodiments, a device (e.g., 10) for coupling as a first device to a set of second devices (e.g., $20_1$, $20_2$, ..., $20_n$) via a bus (e.g., 30) may be configured to transmit over the bus:
- first messages carrying a set of operation data message portions indicative of operations for implementation by second devices in the set of second devices, and
- second messages addressed to second devices in the set of second devices, the second messages requesting respective reactions towards the first device within respective expected reaction intervals, the second messages conveying identifiers identifying respective ones of the second devices to which the second messages are addressed.

In one or more embodiments, a device for coupling as a first device to a set of second devices via a bus may be sensitive to respective reactions requested from second devices in the set of second devices failing to reach the first device within respective expected reaction intervals, and/or may be configured to trigger respective watchdog error signals indicative of second devices in the set of second devices from which respective reactions fail to reach the first device within respective expected reaction intervals.

In one or more embodiments, a device (e.g., $20_i$) for inclusion in a set of second devices (e.g., $20_1$, $20_2$, ..., $20_n$) coupled to a first device (e.g., 10) via a bus (e.g., 30) may be configured to:
- receive over the bus first messages carrying a set of operation data message portions indicative of operations for implementation by second devices in the set of second devices, read at least one respective operation data message portion in the set of operation data message portions and implement at least one respective operation as a function of the at least one respective operation data message portion read,
- receive over the bus respective second messages conveying identifiers identifying the device as the one of the second devices to which the respective second messages are addressed, the respective second messages requesting from the device respective reactions towards the first device within respective expected reaction intervals, and react thereon within the respective expected reaction intervals, wherein reaction messages from the device are transmitted over the bus towards the first device configured as master device.

In one or more embodiments, a device for inclusion in a set of second devices coupled to a first device via a bus may be configured to switch to a fail-safe state as a result of expiration of a respective watchdog timer.

In one or more embodiments, a device for inclusion in a set of second devices coupled to a first device via a bus may be configured to reset a respective watchdog timer as a result of messages received from the first device via the bus.

In one or more embodiments, a device for inclusion in a set of second devices coupled to a first device via a bus may comprise a HW communication and protocol controller (e.g., $20_1$) comprising application-specific hardware implemented therein.

In one or more embodiments, a device for inclusion in a set of second devices coupled to a first device via a bus may comprise a light-radiation source driver, preferably a vehicle light driver.

In one or more embodiments, a vehicle (e.g., V) may be equipped with a system according to one or more embodiments.

In one or more embodiments, a signal transmissible over a bus (e.g., 30) to transmit messages from a first device (e.g., 10) to a set of second devices (e.g., $20_1$, $20_2$, ..., $20_n$) in a system according to one or more embodiments may comprise:
- first messages carrying a set of operation data message portions indicative of operations for implementation by second devices in the set of second devices, and
- second messages addressed to second devices in the set of second devices, the second messages requesting respective reactions towards the first device within respective expected reaction intervals, the second messages conveying identifiers identifying respective ones of the second devices to which the second messages are addressed.

In one or more embodiments, a signal transmitting first messages carrying a set of operation data message portions dedicated to second devices configured as slave devices may occur at a constant rate.

Without prejudice to the underlying principles, the details and embodiments may vary, even significantly, with respect to what has been described by way of example only, without departing from the extent of protection.

The extent of protection is defined by the annexed claims.

What is claimed is:

1. A method, comprising:
   encoding, by a commander device, messages in a CAN FD format using a serial peripheral interface (SPI) protocol to form encoded messages, wherein each encoded message comprises a CRC field and a CRC delimiter following the CRC field; and
   transmitting, by the commander device, first messages of the encoded messages addressed to responder devices in a set of responder devices, the first messages comprising identifiers identifying respective ones of the responder devices to which the first messages are addressed.

2. The method of claim 1, wherein the CRC delimiter comprises a recessive bit.

3. The method of claim 1, wherein each first message further comprises a memory address, data bytes and a write request according to the SPI protocol.

4. The method of claim 1, wherein each first message further comprises a memory address, data bytes and a read request according to the SPI protocol.

5. The method of claim 1, wherein:
   the encoding and the transmitting are performed by a protocol controller of the commander device; and
   the transmitting comprises transmitting the first messages to the responder devices via a bus.

6. A method, comprising:
   receiving, by a responder device of a set of responder devices, messages from a commander device conveying identifiers identifying the responder device as the one of the responder devices to which the messages are addressed, wherein the messages are encoded in a CAN FD format using a serial peripheral interface (SPI) protocol, and each message of the messages comprises a CRC field and a CRC delimiter following the CRC field; and verifying, by the responder device, a correctness of the CRC field and a presence of the CRC delimiter.

7. The method of claim 6, further comprising switching, by the responder device, to a fail-safe state as a result of expiration of a respective watchdog timer.

8. The method of claim 7, further comprising resetting, by the responder device, the respective watchdog timer as a result of the messages received from the commander device.

9. The method of claim 6, wherein the responder device is a light-radiation source driver.

10. The method of claim 9, wherein the responder device is a vehicle light driver.

11. The method of claim 6, wherein the CRC delimiter comprises a recessive bit.

12. The method of claim 6, wherein:
each message of the messages further comprises a memory address, data bytes and a write request according to the SPI protocol; and
the method further comprises writing, by the responder device, the data bytes in a memory in response to receiving the memory address, the data bytes and the write request.

13. The method of claim 6, wherein each message of the messages further comprises a memory address, data bytes and a read request according to the SPI protocol.

14. The method of claim 6, wherein:
the receiving and the verifying are performed by a communication and protocol controller circuit of the responder device; and
the receiving comprises receiving the messages from the commander device via a bus.

15. A non-transitory computer readable medium with instructions stored thereon, wherein the instructions, when executed by a processor of a responder device in a set of responder devices, enable the processor to perform the steps of:

receiving messages from a commander device conveying identifiers identifying the responder device as the one of the responder devices to which the messages are addressed, wherein the messages are encoded in a CAN FD format using a serial peripheral interface (SPI) protocol, and each message of the messages comprises a CRC field and a CRC delimiter following the CRC field; and verifying a correctness of the CRC field and a presence of the CRC delimiter.

16. The non-transitory computer readable medium of claim 15, wherein the instructions, when executed by the processor, further enable the processor to perform the step of switching to a fail-safe state as a result of expiration of a respective watchdog timer.

17. The non-transitory computer readable medium of claim 16, wherein the instructions, when executed by the processor, further enable the processor to perform the step of resetting the respective watchdog timer as a result of the messages received from the commander device.

18. The non-transitory computer readable medium of claim 15, wherein the CRC delimiter comprises a recessive bit.

19. The non-transitory computer readable medium of claim 15, wherein:
each message of the messages further comprises a memory address, data bytes and a write request according to the SPI protocol; and
the instructions, when executed by the processor, further enable the processor to perform the step of writing the data bytes in a memory in response to receiving the memory address, the data bytes and the write request.

20. The non-transitory computer readable medium of claim 15, wherein each message of the messages further comprises a memory address, data bytes and a read request according to the SPI protocol.

\* \* \* \* \*